(12) United States Patent
Huang

(10) Patent No.: US 12,453,007 B2
(45) Date of Patent: Oct. 21, 2025

(54) ELECTRONIC DEVICE

(71) Applicant: Innolux Corporation, Miaoli County (TW)

(72) Inventor: Zhi-Fu Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 305 days.

(21) Appl. No.: 18/343,772

(22) Filed: Jun. 29, 2023

(65) Prior Publication Data

US 2024/0032192 A1    Jan. 25, 2024

Related U.S. Application Data

(60) Provisional application No. 63/391,319, filed on Jul. 22, 2022, provisional application No. 63/391,318, filed on Jul. 22, 2022.

(30) Foreign Application Priority Data

May 4, 2023 (CN) .......................... 202310490690.2

(51) Int. Cl.
| | |
|---|---|
| *H05K 1/11* | (2006.01) |
| *H01L 23/00* | (2006.01) |
| *H05K 3/32* | (2006.01) |

(52) U.S. Cl.
CPC .............. *H05K 1/111* (2013.01); *H01L 24/08* (2013.01); *H05K 3/32* (2013.01); *H01L 2224/08145* (2013.01); *H05K 2201/0317* (2013.01); *H05K 2201/07* (2013.01); *H05K 2201/09409* (2013.01)

(58) Field of Classification Search
CPC .......... H05K 1/111; H05K 3/32; H01L 24/08; H01L 2224/08145
USPC ....................................................... 361/748
See application file for complete search history.

(56) References Cited

U.S. PATENT DOCUMENTS

| | | | | |
|---|---|---|---|---|
| 2012/0096743 | A1* | 4/2012 | Surve ................... | A61B 5/6804 36/83 |
| 2016/0233571 | A1* | 8/2016 | Lo Hine Tong ......... | H01Q 9/42 |
| 2021/0329782 | A1 | 10/2021 | Li | |

\* cited by examiner

*Primary Examiner* — Andargie M Aychillhum
(74) *Attorney, Agent, or Firm* — JCIPRNET

(57) ABSTRACT

An electronic device, including multiple electronic elements, a first substrate, a second substrate, and a third substrate, is provided. The first substrate includes a first device element and a first connection pad. The second substrate includes a second device element and a second connection pad. The third substrate includes a first connection line, wherein the first connection pad and the second connection pad are coupled to the first connection line, and the first substrate, the second substrate, and the electronic elements are disposed on the third substrate.

19 Claims, 7 Drawing Sheets

ELECTRONIC DEVICE

CROSS-REFERENCE TO RELATED APPLICATION

This application claims the priority benefit of U.S. provisional application Ser. No. 63/391,318, filed on Jul. 22, 2022, U.S. provisional application Ser. No. 63/391,319, filed on Jul. 22, 2022, and China application serial no. 202310490690.2, filed on May 4, 2023. The entirety of each of the above-mentioned patent applications is hereby incorporated by reference herein and made a part of this specification.

BACKGROUND

Technical Field

The disclosure relates to an electronic device.

Description of Related Art

When forming an electronic device, there may be different process capability requirements for different elements. Therefore, some elements of the electronic device may be independently produced on different substrates and then bonded, so that the production of the elements is more flexible. However, if the number of connection pads of the substrate and the number of times of bonding are too many, the process cost of the electronic device will be increased.

SUMMARY

The disclosure provides an electronic device, which can reduce the process cost.

An electronic device provided according to some embodiments of the disclosure includes multiple electronic element, a first substrate, a second substrate, and a third substrate. The first substrate includes a first device element and a first connection pad. The second substrate includes a second device element and a second connection pad. The third substrate includes a first connection line. The first connection pad and the second connection pad are coupled to the first connection line, and the first substrate, the second substrate, and the electronic elements are disposed on the third substrate.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DETAILED DESCRIPTION OF DISCLOSED EMBODIMENTS

Figure 1A:
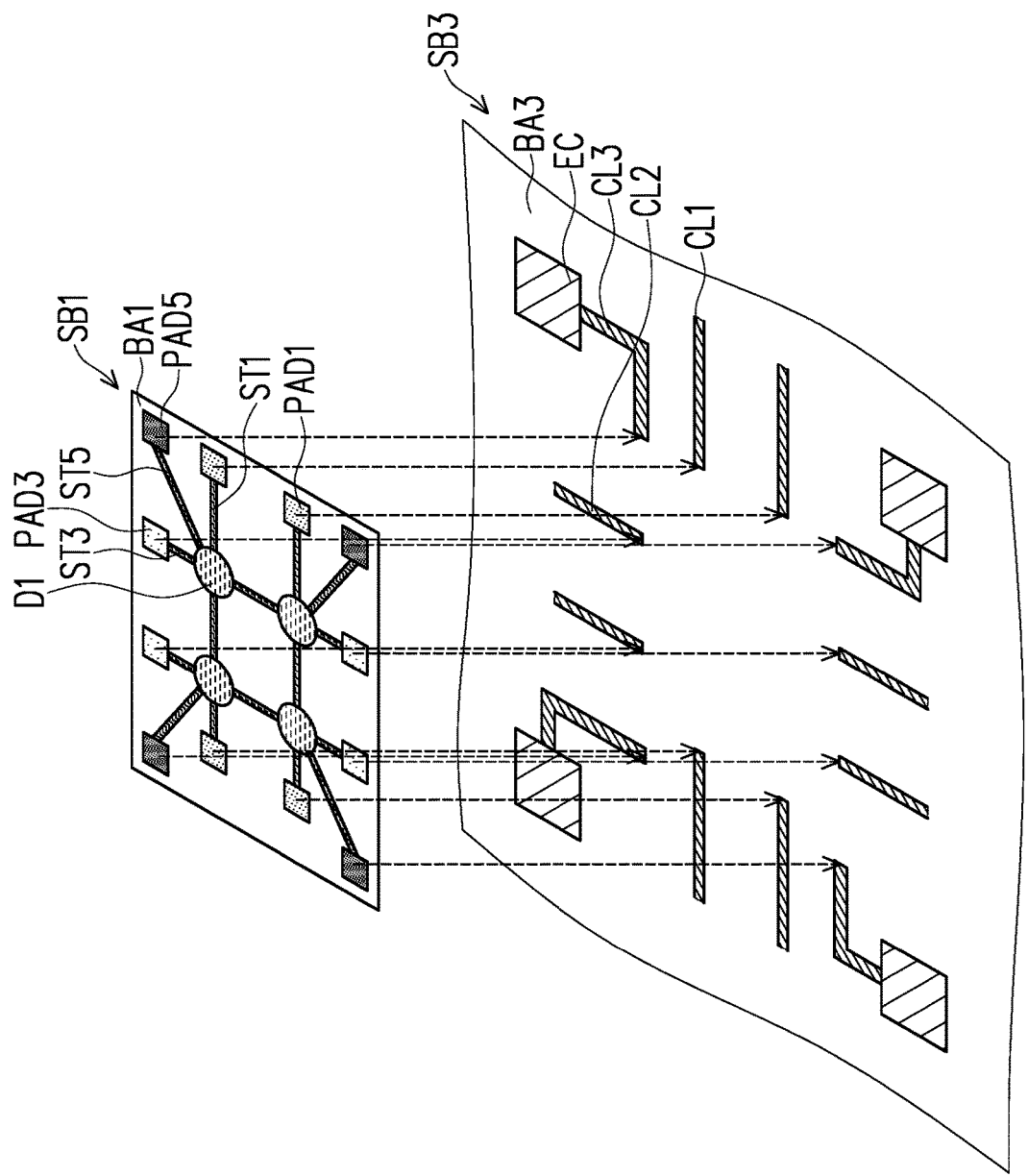
FIG. 1A is an exploded view of an electronic device according to a first embodiment of the disclosure.

Reference will now be made in detail to the exemplary embodiments of the disclosure, examples of which are illustrated in the drawings. Wherever possible, the same reference numerals are used in the drawings and the description to refer to the same or similar parts.

The disclosure may be understood by referring to the following detailed description in conjunction with the drawings. It should be noted that in order to facilitate the understanding of the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

Throughout the specification and the appended claims of the disclosure, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "including", "containing", and "having" are open-ended terms, so the terms should be interpreted as "containing but not limited to . . . ". Therefore, when the terms "including", "containing", and/or "having" are used in the description of the disclosure, the terms designate the presence of a corresponding feature, region, step, operation, and/or component, but do not exclude the presence of one or more corresponding features, regions, steps, operations, and/or components.

Directional terms such as "upper", "lower", "front", "rear", "left", and "right" mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, for clarity, relative sizes, thicknesses, and positions of various film layers, regions, and/or structures may be reduced or enlarged.

When a corresponding component (for example, a film layer or a region) is referred to as being "on another component", the component may be directly on the other component or there may be another component between the two. On the other hand, when a component is referred to as being "directly on another component", there is no component between the two. In addition, when a component is referred to as being "on another component", the two have an upper-lower relationship in the top view direction, and the component may be above or below the other component, and the upper-lower relationship depends on the orientation of the device.

The terms "equal" or "same", "substantially", or "roughly" are generally interpreted as within 20% of a given value or range or interpreted as within 10%, 5%, 3%, 2%, 1%, or 0.5% of the given value or range.

Ordinal numbers such as "first" and "second" used in the specification and the claims are used to modify elements, and the terms do not imply and represent that the element(s) have any previous ordinal numbers, nor do they represent the order of a certain element and another element or the order of a manufacturing method. The use of the ordinal numbers is only to clearly distinguish between an element with a certain name and another element with the same name. The claims and the specification may not use the same terms, whereby a first component in the specification may be a second component in the claims.

It should be noted that in the following embodiments, features in several different embodiments may be replaced, recombined, and mixed to complete other embodiments without departing from the spirit of the disclosure. As long as the features of the various embodiments do not violate the spirit of the invention or conflict with each other, the features may be arbitrarily mixed and matched.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, other suitable elements, or a combination of the above elements between the terminals of the elements on the two circuits, but not limited thereto.

In the disclosure, the measurement manner of thickness, length, width, and area may be by adopting an optical microscope, and the thickness may be obtained by measuring a cross-sectional image in an electron microscope, but not limited thereto. In addition, there may be a certain error in any two values or directions for comparison. If a first value is equal to a second value, it implies that there may be an error of about 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

An electronic device of the disclosure may include display, light emitting, antenna, sensing, touch, splicing, other suitable functions, or a combination of the above functions, but not limited thereto. The electronic device includes a rollable or flexible electronic device, but not limited thereto. A display device may, for example, include liquid crystal, a light emitting diode (LED), quantum dot (QD), fluorescence, phosphor, other suitable materials, or a combination of the above. The light emitting diode may, for example, include an organic light emitting diode (OLED), a micro LED, a mini LED, a QLED, or a QDLED, but not limited thereto. An antenna device may, for example, be a liquid crystal antenna or a varactor diode antenna, but not limited thereto. An electronic element may include an active or passive element, such as a transistor, a circuit board, a chip, a die, an integrated circuit (IC), a combination of the above elements, or other suitable electronic elements, but not limited thereto.

Figure 1B:
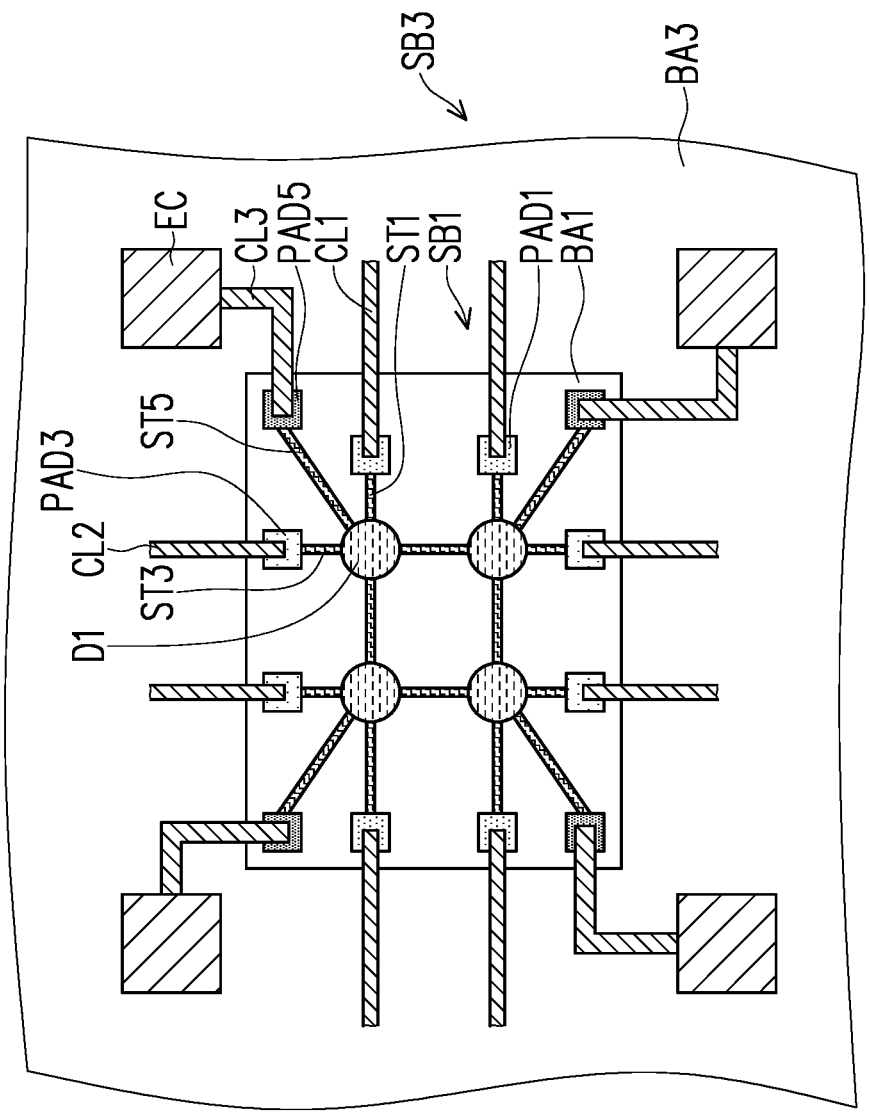
FIG. 1B is a schematic partial top view of the electronic device according to the first embodiment of the disclosure.
Figure 1C:
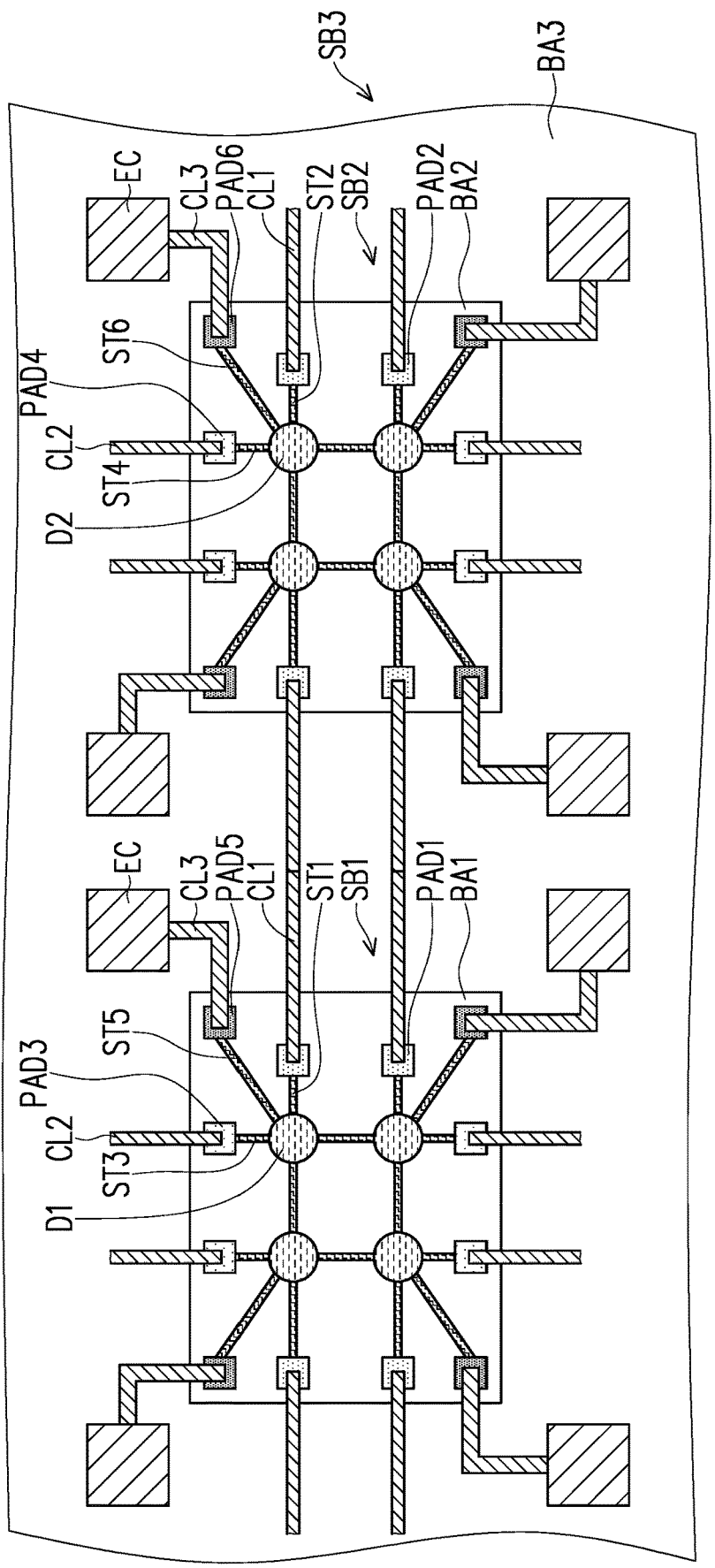
FIG. 1C is a schematic partial top view of a coupling relationship between a first substrate and a second substrate of the electronic device according to the first embodiment of the disclosure.

FIG. 1A is an exploded view of an electronic device according to a first embodiment of the disclosure, FIG. 1B is a schematic partial top view of the electronic device according to the first embodiment of the disclosure, and FIG. 1C is a schematic partial top view of a coupling relationship between a first substrate and a second substrate of the electronic device according to the first embodiment of the disclosure.

Please refer to FIG. 1A, FIG. 1B, and FIG. 1C at the same time. An electronic device 10a of the embodiment includes multiple electronic elements EC, a first substrate SB1, a second substrate SB2, and a third substrate SB3, but the disclosure is not limited thereto.

The electronic elements EC are, for example, disposed on the third substrate SB3. In some embodiments, the electronic elements EC may include photoelectric elements, thermoelectric elements, piezoelectric elements, sensing elements, or antenna elements, but the disclosure is not limited thereto. For example, when the electronic device 10a of the embodiment is a photosensitive device, the electronic elements EC may include multiple photoelectric elements, wherein a semiconductor in the photoelectric element may receive light and generate carriers (for example, electrons and/or holes). Then, the carriers may be transmitted to an external circuit through corresponding signal lines (for example, read lines) to implement the function of light sensing. In addition, when the electronic device 10a of the embodiment is a light emitting device (for example, an organic light emitting diode display device, a micro light emitting diode display device, or a mini light emitting diode display device), the electronic elements EC may include multiple light emitting elements, which may emit light of various suitable colors or UV light. The light emitting element includes, for example, an organic light emitting diode (OLED), an inorganic light emitting diode, such as a mini LED, a micro LED, quantum dot (QD), a QLED, or a QDLED, fluorescence, phosphor, other suitable materials, or a combination of the above materials, but the disclosure is not limited thereto. In addition, when the electronic device 10a of the embodiment is the antenna device, the electronic element EC may include a varactor diode and may change the magnitude of the capacitance value of the varactor diode through changing the voltage across two terminals of the varactor diode. Therefore, through adjusting the capacitance value of the varactor diode, the electronic device 10a of the embodiment may adjust the operating frequency band, but the disclosure is not limited thereto.

The first substrate SB1 is, for example, disposed on the third substrate SB3. In some embodiments, the first substrate SB1 and the third substrate SB3 are bonded to each other in a third direction d3 (a top view direction of the third substrate SB3), but the disclosure is not limited thereto. In the embodiment, the first substrate SB1 includes a first device element D1 and a first connection pad PAD1. The first device element D1 may, for example, include at least one transistor, which may be a thin film transistor, a bipolar junction transistor, or a combination thereof to have the purposes of switching and/or signal amplification, but the disclosure is not limited thereto. In the embodiment, the first device element D1 includes at least one thin film transistor. The first device element D1 may be, for example, coupled to the first connection pad PAD1. In some embodiments, the first substrate SB1 may further include a first signal transmission line ST1, wherein the first device element D1 may be coupled to the first connection pad PAD1 through the first signal transmission line ST1, but the disclosure is not limited thereto. In addition, the first connection pad PAD1 may be, for example, coupled to the external circuit such as a driving circuit (not shown), a circuit board (not shown), or a chip (not shown) disposed on the third substrate SB3 to, for example, control the first device element D1 through the external circuit, but the disclosure is not limited thereto. The material of the first connection pad PAD1 may include a metal, an alloy, a metal oxide, or a combination thereof, and the first connection pad PAD1 may, for example, be a single-layer structure or a multi-layer structure, but the disclosure is not limited thereto. In some embodiments, the first substrate SB1 further includes a first base BA1. The material of the first base BA1 may, for example, be glass, plastic, or a combination thereof. For example, the material of the first base BA1 may include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials, but the disclosure is not limited thereto. In the embodiment, the material of the first base BA1 is glass, but the disclosure is not limited thereto.

The second substrate SB2 is, for example, disposed on the third substrate SB3. In some embodiments, the second substrate SB2 and the third substrate SB3 are bonded to each other in the third direction d3, but the disclosure is not limited thereto. In the embodiment, the second substrate SB2 includes a second device element D2 and a second connection pad PAD2. The second device element D2 may also include at least one transistor, which may be a thin film transistor, a bipolar junction transistor, or a combination thereof to have the purposes of switching and/or signal amplification, but the disclosure is not limited thereto. In the embodiment, the second device element D2 includes at least one thin film transistor. The second device element D2 may be, for example, coupled to the second connection pad PAD2. In some embodiments, the second substrate SB2 may further include a second signal transmission line ST2, wherein the second device element D2 may be coupled to the second connection pad PAD2 through the second signal transmission line ST2. In addition, the second connection pad PAD2 may be, for example, coupled to the external circuit such as the driving circuit (not shown), the circuit board (not shown), or the chip (not shown) disposed on the third substrate SB3 to, for example, control the second device element D2 through the external circuit, but the disclosure is not limited thereto. The material of the second connection pad PAD2 may include a metal, an alloy, a metal oxide, or a combination thereof, and the second connection pad PAD2 may, for example, be a single-layer structure or a multi-layer structure, but the disclosure is not limited thereto. In some embodiments, the second substrate SB2 further includes a second base BA2. The material of the second base BA2 may, for example, be glass, plastic, or a combination thereof. For example, the material of the second base BA2 may include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials, but the disclosure is not limited thereto. In the embodiment, the material of the second base BA2 is the same as the material of the first base BA1, that is, the material of the second base BA2 is glass, but the disclosure is not limited thereto.

In some embodiments, the first substrate SB1 may further include a third connection pad PAD3 and a third signal transmission line ST3, and the second substrate SB2 may further include a fourth connection pad PAD4 and a fourth signal transmission line ST4.

The third connection pad PAD3 may be, for example, coupled to the first device element D1, but the disclosure is not limited thereto. In some embodiments, the third connection pad PAD3 may be coupled to the external circuit such as the driving circuit (not shown), the circuit board (not shown), or the chip (not shown) disposed on the third substrate SB3 to be, for example, used to control the first device element D1, but the disclosure is not limited thereto. In some embodiments, the first device element D1 may be coupled to the third connection pad PAD3 through the third signal transmission line ST3, but the disclosure is not limited thereto.

The fourth connection pad PAD4 may be, for example, coupled to the second device element D2, but the disclosure is not limited thereto. In some embodiments, the fourth connection pad PAD4 may be coupled to the external circuit such as the driving circuit (not shown), the circuit board (not shown), or the chip (not shown) disposed on the third substrate SB3 to be, for example, used to control the second device element D2, but the disclosure is not limited thereto. In some embodiments, the second device element D2 may be coupled to the fourth connection pad PAD4 through the fourth signal transmission line ST4, but the disclosure is not limited thereto.

In some embodiments, the first substrate SB1 and the second substrate SB2 may be disposed together on the third substrate SB3 in an array arrangement, but the disclosure is not limited thereto. In addition, in the embodiment, the first substrate SB1 and the second substrate SB2 are disposed on the third substrate SB3, but the disclosure is not limited thereto. In some embodiments, the first substrate SB1 and the second substrate SB2 may be disposed in an active area or a peripheral area. In some embodiments, any one of the first substrate SB1 and the second substrate SB2 may be disposed in the active area and the other one may be disposed in the peripheral area. In some embodiments, the first substrate SB1 and the second substrate SB2 may both be disposed in the active area. In some embodiments, the first substrate SB1 and the second substrate SB2 may both be disposed in the peripheral area. The active area may, for example, be a display area, a light emitting area, an antenna operating area, etc. depending on the application of the electronic device, but the disclosure is not limited thereto.

The third substrate SB3 includes, for example, a first connection line CL1, wherein the first connection pad PAD1 and the second connection pad PAD2 are coupled to the first connection line CL1. In detail, in some embodiments, first connection line CL1 may be coupled to the external circuit such as the driving circuit (not shown), the circuit board (not shown), or the chip (not shown) to sequentially transmit signals from the external circuit to the first connection pad PAD1 disposed on the first substrate SB1 and the second connection pad PAD2 disposed on the second substrate SB2, so as to respectively control the first device element D1 and the second device element D2 through the first connection pad PAD1 and the second connection pad PAD2. In the embodiment, the first connection line CL1 extends along a first direction d1, and the first connection line CL1 may be a scan line, but the disclosure is not limited thereto.

In some embodiments, the third substrate SB3 may further include a second connection line CL2, wherein the third connection pad PAD3 and the fourth connection pad PAD4 are coupled to the corresponding second connection line CL2. In detail, in some embodiments, the second connection line CL2 may be coupled to the external circuit such as the driving circuit (not shown), the circuit board (not shown), or the chip (not shown) to sequentially transmit the signals from the external circuit to the third connection pad PAD3 disposed on the first substrate SB1 and the fourth connection pad PAD4 disposed on the second substrate SB2, so as to respectively control the first device element D1 and the second device element D2 through the third connection pad PAD3 and the fourth connection pad PAD4. In the embodiment, the second connection line CL2 extends along a second direction d2, and the second connection line CL2 is a data line, but the disclosure is not limited thereto. In some embodiments, the second direction d2 may be orthogonal to the first direction d1, and the second direction d2 and the first direction d1 may be orthogonal to the third direction d3, but the disclosure is not limited thereto.

It should be noted that in other embodiments, the first connection line CL1 may be the scan line, and the second connection line CL2 may be the data line. Alternatively, in other embodiments, the first connection line CL1 and/or the second connection line CL2 are not limited to the scan line and the data line. For example, the first connection line CL1 and/or the second connection line CL2 may be power supply lines, ground lines, or other wiring for transmitting signals. In some embodiments, a driving signal from the external circuit may be a data signal or a power signal, but the disclosure is not limited thereto. In some embodiments, the driving signals transmitted to the first substrate SB1 and the second substrate SB2 may be the same or different, but the disclosure is not limited thereto. In some embodiments, the driving signals transmitted to the first substrate SB1 and the second substrate SB2 include scan driving signals, data driving signals, power driving signals, or other transmission signals, but the disclosure is not limited thereto.

In some embodiments, the third substrate SB3 further includes a third base BA3. The material of the third base BA3 may, for example, be glass, plastic, or a combination thereof. For example, the material of the third base BA3 may include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials, but the disclosure is not limited thereto.

In addition, although not shown in FIG. 1A to FIG. 1C, the third substrate SB3 may further include suitable elements such as an insulating layer, a capacitor, and/or multiple electrodes, but the disclosure is not limited thereto.

Through the configuration of disposing the first substrate SB1 and the second substrate SB2 on the third substrate SB3, in the embodiment, the first connection line CL1 and the second connection line CL2 may be disposed on the same layer. For example, the first connection line CL1 and the second connection line CL2 on the third substrate SB3 belong to the same layer, which can reduce the process steps and/or the number of masks used when forming the first connection line CL1 and the second connection line CL2, so as to reduce the design difficulty of the third substrate SB3 to improve the yield of the electronic device 10a.

In some embodiments, the first substrate SB1 and the second substrate SB2 may include chips, and the third substrate SB3 may include a wafer, then the first connection line CL1 and the second connection line CL2 may include materials with anti-corrosion functions, but the disclosure is not limited thereto.

In some embodiments, the first substrate SB1 may further include a fifth connection pad PAD5 and a fifth signal transmission line ST5, the second substrate SB2 may further include a sixth connection pad PAD6 and a sixth signal transmission line ST6, and the third substrate SB3 may further include a third connection line CL3.

The fifth connection pad PAD5 may be, for example, coupled to the first device element D1 and the electronic elements EC disposed on the third substrate SB3 to, for example, control the corresponding electronic element EC through the first device element D1, but the disclosure is not limited thereto. In some embodiments, the first device element D1 may be coupled to the fifth connection pad PAD5 through the fifth signal transmission line ST5, and the electronic elements EC may be coupled to the fifth connection pad PAD5 through the third connection line CL3, but the disclosure is not limited thereto.

The sixth connection pad PAD6 may be, for example, coupled to the second device element D2 and the electronic elements EC disposed on the fourth substrate SB4 to, for example, control the corresponding electronic element EC through the second device element D2, but the disclosure is not limited thereto. In some embodiments, the second device element D2 may be coupled to the sixth connection pad PAD6 through the sixth signal transmission line ST6, and the electronic elements EC may be coupled to the sixth connection pad PAD6 through the third connection line CL3, but the disclosure is not limited thereto.

The following will introduce the arrangement manner of the first device elements D1 included in the first substrate SB1 and the first connection pads PAD1, the third connection pads PAD5, and the fifth connection pads PAD5 of the embodiment, and the quantitative relationship therebetween, but the disclosure is not limited thereto.

In the embodiment, the first device elements D1 are disposed in an array arrangement. In detail, the first device elements D1 may be arranged along the first direction d1 and the second direction d2, but the disclosure is not limited thereto. In other embodiments, the first device elements D1 may be disposed in a staggered arrangement or a unidirectional arrangement. In the embodiment, the first device elements D1 may have the same or different numbers in the first direction d1 and the second direction d2. For example, there may be n1 first device elements D1 arranged in the first direction d1, and there may be n2 first device elements D1 arranged in the second direction d2, where n1 and n2 are positive integers and at least one of n1 and n2 is greater than or equal to 2. In this case, the first substrate SB1 may include n1*n2 first device elements D1. The first substrate SB1 and the second substrate SB2 may include square, rectangular, or other quadrilateral designs, but the disclosure is not limited thereto.

In the embodiment, the first connection pads PAD1 are disposed on two corresponding sides of the first substrate SB1. In detail, the first connection pads PAD1 may include, for example, a first input connection pad and a first output connection pad disposed on the two corresponding sides of the first substrate SB1, wherein the first input connection pad may, for example, receive a signal from the external circuit such as the scan (gate) driving circuit (not shown), the circuit board (not shown), or the chip (not shown), and the first output connection pad may be, for example, used to transmit the signal to the second substrate SB2 through the first connection line CL1. In the embodiment, the first input connection pad and the first output connection pad are respectively arranged in the second direction d2, and each first input connection pad and each first output connection pad are respectively disposed corresponding to the first device element D1 arranged in the second direction d2. In detail, if there are n1 first device elements D1 arranged in the first direction d1, and there are n2 first device elements D1 arranged in the second direction d2, the first substrate SB1 may include 2*n2 first connection pads PAD1, but the disclosure is not limited thereto. The numbers of the first connection pads PAD1 and the first device elements D1 may be the same or different.

In the embodiment, the third connection pads PAD3 are disposed on the two corresponding sides of the first substrate SB1. In detail, the third connection pads PAD3 may, for example, include a third input connection pad and a third output connection pad disposed on the two corresponding sides of the first substrate SB1, wherein the third input connection pad may, for example, receive a signal from the external circuit such as the data (source) driving circuit (not shown), the circuit board (not shown), or the chip (not shown), and the third output connection pad may be, for example, used to transmit the signal to another substrate (not shown) through the second connection line CL2. In the embodiment, the third input connection pad and the third output connection pad are respectively arranged in the first direction d1, and each third input connection pad and each third output connection pad are respectively disposed corresponding to the first device element D1 arranged in the first direction d1. In detail, the first substrate SB1 may also include 2*n1 third connection pads PAD3, but the disclosure is not limited thereto. The numbers of the third connection pads PAD3 and the first device elements D1 may be the same or different.

In the embodiment, the fifth connection pads PAD5 may be disposed in an array arrangement and disposed corresponding to the first device elements D1 or the electronic elements EC. In detail, the fifth connection pads PAD5 may be arranged along the first direction d1 and the second direction d2. In the embodiment, if there are n1 first device elements D1 or electronic elements EC arranged in the first direction d1, and there are n2 first device elements D1 or electronic elements EC arranged in the second direction d2, the first substrate SB1 may include n1*n2 fifth connection pads PAD5, but the disclosure is not limited thereto. The numbers of the fifth connection pads PAD5 and the first device elements D1 may be the same or different.

In general, the quantitative relationship between the first device elements D1 and the first connection pads PAD1, the third connection pads PAD3, and the fifth connection pads PAD5 of the embodiment may be summarized in Table 1 below.

It is worth noting that the quantitative relationship between the first device elements D1 and the first connection pads PAD1, the third connection pads PAD3, and the fifth connection pads PAD5 of the disclosure is not limited to Table 1. For example, if there are 4 first device elements D1 arranged in the first direction d1 (n1=4), and there is 1 first device element D1 arranged in the second direction d2 (n2=1), the number of the first connection pads PAD1 may be 2 (2*n2), the number of the third connection pads PAD3 may be 8 (2*n1), the number of the fifth connection pads PAD5 may be 4 (n1*n2), and the total number of the connection pads is 14 (2*n2+2*n1+n1*n2), as shown in Table 2 below.

TABLE 2

| Number of first device element D1 (n1*n2, n1 = 4, n2 = 1) | Number of first connection pad PAD1 (2*n2) | Number of third connection pad PAD3 (2*n1) | Number of fifth connection pad PAD5 (n1*n2) | Total number of connection pad (2*n2 + 2*n1 + n1*n2) | Total number of connection pad 1 Number of first device element D1 |
|---|---|---|---|---|---|
| 4 | 2 | 8 | 4 | 14 | 3.5 |

In the embodiment, the arrangement manner of the second device elements D2 is the same as or similar to the arrangement manner of the first device elements D1, that is, the second device elements D2 may also be disposed in an array arrangement. Based on this, reference may be made to the arrangement manner and the number of the first device elements D1 for the arrangement manner and the number of the second device elements D2, which will not be repeated here. However, in other embodiments, the arrangement manner of the second device elements D2 may be different from the arrangement manner of the first device elements D1.

Based on this, reference may be made to the foregoing embodiment for the arrangement manner of the second device elements D2 included in the second substrate SB2 and the second connection pads PAD2, the fourth connection pads PAD4, and the sixth connection pads PAD6 of the embodiment, and the quantitative relationship therebetween, that is, the same may be the same as or similar to the arrangement manner of the first device elements D1 included in the first substrate SB1 and the first connection pads PAD1, the third connection pads PAD3, and the fifth connection pads PAD5, and the quantitative relationship therebetween, but the disclosure is not limited thereto.

Figure 2:
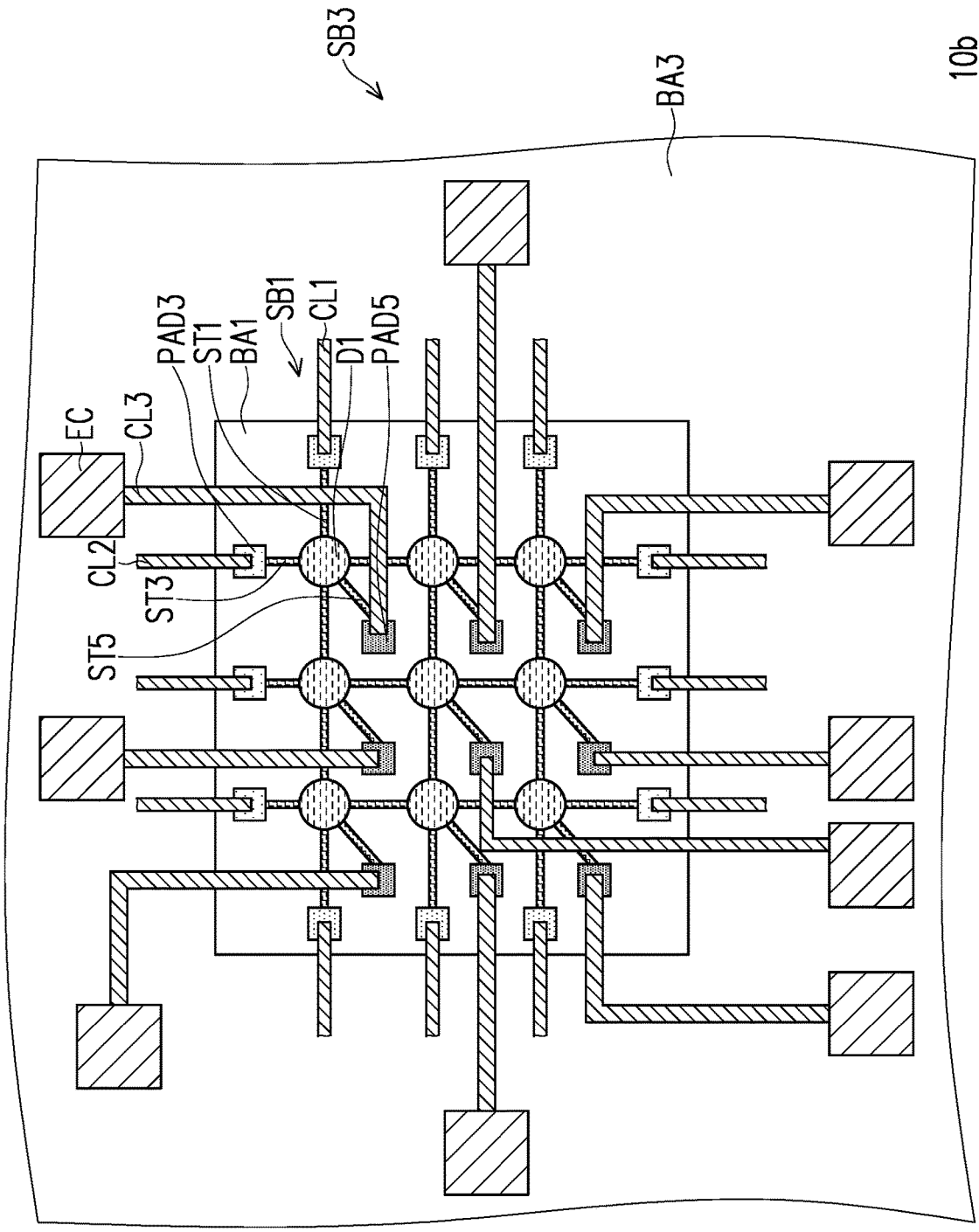
FIG. 2 is a schematic partial top view of an electronic device according to a second embodiment of the disclosure.

FIG. 2 is a schematic partial top view of an electronic device according to a second embodiment of the disclosure. It should be noted that the embodiment of FIG. 2 may continue to use the reference numerals and some content of

TABLE 1

| Number of first device element D1 (n1*n2, n1 = 2, n2 = 2) | Number of first connection pad PAD1 (2*n2) | Number of third connection pad PAD3 (2*n1) | Number of fifth connection pad PAD5 (n1*n2) | Total number of connection pad (2*n2 + 2*n1 + n1*n2) | Total number of connection pad/ Number of first device element D1 |
|---|---|---|---|---|---|
| 4 | 4 | 4 | 4 | 12 | 3.0 | the embodiment of FIG. 1B, wherein the same or similar reference numerals are adopted to denote the same or similar elements, and the description of the same technical content is omitted.

Please refer to FIG. 2. The main difference between an electronic device 10b of the embodiment and the electronic device 10a is that 1 first substrate SB1 of the electronic device 10b includes 9 ($3^2$) first device elements D1.

In general, the quantitative relationship between the first device elements D1 and the first connection pads PAD1, the third connection pads PAD3, and the fifth connection pads PAD5 of the embodiment may be summarized in Table 3 below.

TABLE 3

| Number of first device element D1 ($n1*n2$, $n1 = 3$, $n2 = 3$) | Number of first connection pad PAD1 ($2*n2$) | Number of third connection pad PAD3 ($2*n1$) | Number of fifth connection pad PAD5 ($n1*n2$) | Total number of connection pad ($2*n2 + 2*n1 + n1*n2$) | Total number of connection pad/Number of first device element D1 |
|---|---|---|---|---|---|
| 9 | 6 | 6 | 9 | 21 | 2.3 |

In the embodiment, 1 first substrate SB1 of the electronic device 10b includes multiple opposite first device elements D1 (or second device elements D2), and the first device elements D1 (or the second device elements D2) are disposed in an array arrangement, so the ratio of the total number of connection pads of the electronic device 10b to the number of the first device elements D1 (or the second device elements D2) may be relatively low, which can further reduce the number of the connection pads disposed to reduce the process cost.

In the embodiment, reference may be made to Table 3 for the arrangement manner of the second device elements D2 included in the second substrate SB2 and the second connection pads PAD2, the fourth connection pads PAD4, and the sixth connection pads PAD6, and the quantitative relationship therebetween, which will not be repeated here.

In addition, although not shown in the drawings, when the numbers of the first device elements D1 of the embodiment are respectively 2, 3, and 5, the quantitative relationship between the first device elements D1 and the first connection pads PAD1, the third connection pads PAD3, and the fifth connection pads PAD5 are respectively summarized in Table 4, Table 5, and Table 6 below, which take the arrangement of the first device elements D1 along the first direction d1 as an example, but the disclosure is not limited thereto.

TABLE 4

| Number of first device element D1 ($n1*n2$, $n1 = 2$, $n2 = 1$) | Number of first connection pad PAD1 ($2*n2$) | Number of third connection pad PAD3 ($2*n1$) | Number of fifth connection pad PAD5 ($n1*n2$) | Total number of connection pad ($2*n2 + 2*n1 + n1*n2$) | Total number of connection pad/Number of first device element D1 |
|---|---|---|---|---|---|
| 2 | 2 | 4 | 2 | 8 | 4.0 |

TABLE 5

| Number of first device element D1 ($n1*n2$, $n1 = 3$, $n2 = 1$) | Number of first connection pad PAD1 ($2*n2$) | Number of third connection pad PAD3 ($2*n1$) | Number of fifth connection pad PAD5 ($n1*n2$) | Total number of connection pad ($2*n2 + 2*n1 + n1*n2$) | Total number of connection pad/Number of first device element D1 |
|---|---|---|---|---|---|
| 3 | 2 | 6 | 3 | 11 | 3.7 |

TABLE 6

| Number of first device element D1 ($n1*n2$, $n1 = 5$, $n2 = 1$) | Number of first connection pad PAD1 ($2*n2$) | Number of third connection pad PAD3 ($2*n1$) | Number of fifth connection pad PAD5 ($n1*n2$) | Total number of connection pad ($2*n2 + 2*n1 + n1*n2$) | Total number of connection pad/Number of first device element D1 |
|---|---|---|---|---|---|
| 5 | 2 | 10 | 5 | 17 | 3.4 |

Figure 3:
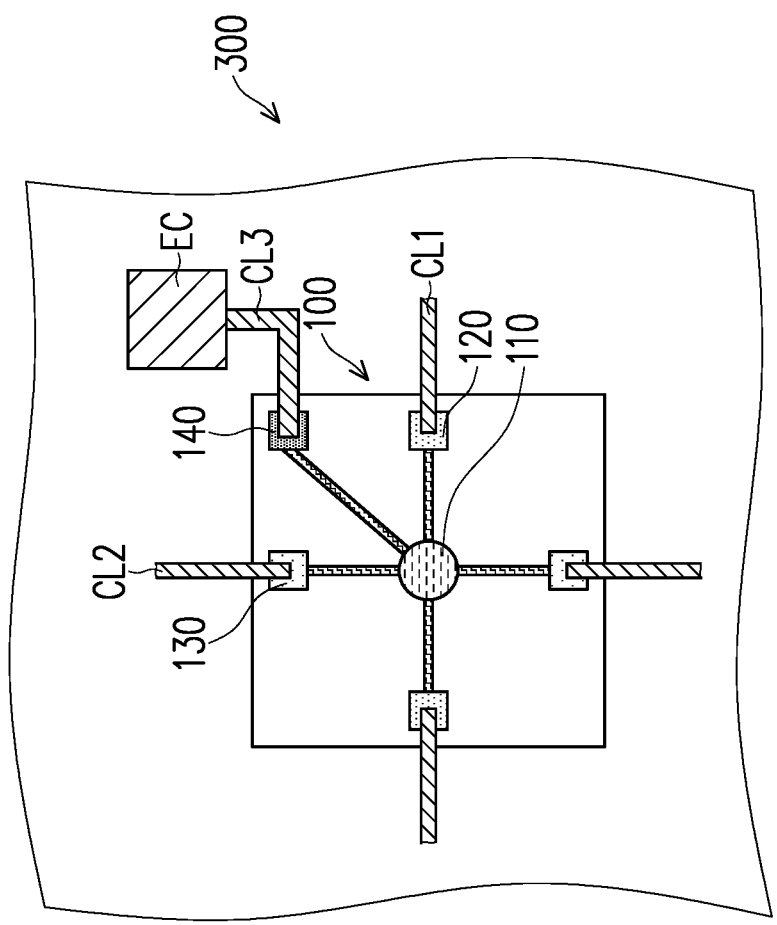
FIG. 3 is a schematic partial top view of an electronic device according to a comparative example.

FIG. 3 is a schematic partial top view of an electronic device according to a comparative example.

Please refer to FIG. 3. The main difference between an electronic device 20 of the comparative example and the electronic device 10a is that 1 first substrate 100 of the electronic device 20 of the comparative example includes 1 first device element 110.

In general, the quantitative relationship between the first device element 110 and the first connection pads 120, the third connection pads 130, and the fifth connection pad 140 of the electronic device 20 of the comparative example may be summarized in Table 7 below.

TABLE 7

| Number of first device element 110 ($n1*n2$, $n1 = 1$, $n2 = 1$) | Number of first connection pad 120 ($2*n2$) | Number of third connection pad 130 ($2*n1$) | Number of fifth connection pad 140 ($n1*n2$) | Total number of connection pad ($2*n2 + 2*n1 + n1*n2$) | Total number of connection pad/Number of first device element 110 |
|---|---|---|---|---|---|
| 1 | 2 | 2 | 1 | 5 | 5.0 |

Compared with the electronic device 10a, only 1 first device element 110 is disposed on the first substrate 100 of the electronic device 20 of the comparative example, so the ratio of the total number of the connection pads of the electronic device 20 of the comparative example to the number of the first device element 110 is relatively high, which increases the number of the connection pads disposed to increase the process cost. Furthermore, the number of times of bonding between the first substrate 100 and a third substrate 300 of the electronic device 20 of the comparative example is relatively large, which increases the process cost of the electronic device 20 of the comparative example.

Figure 4A:
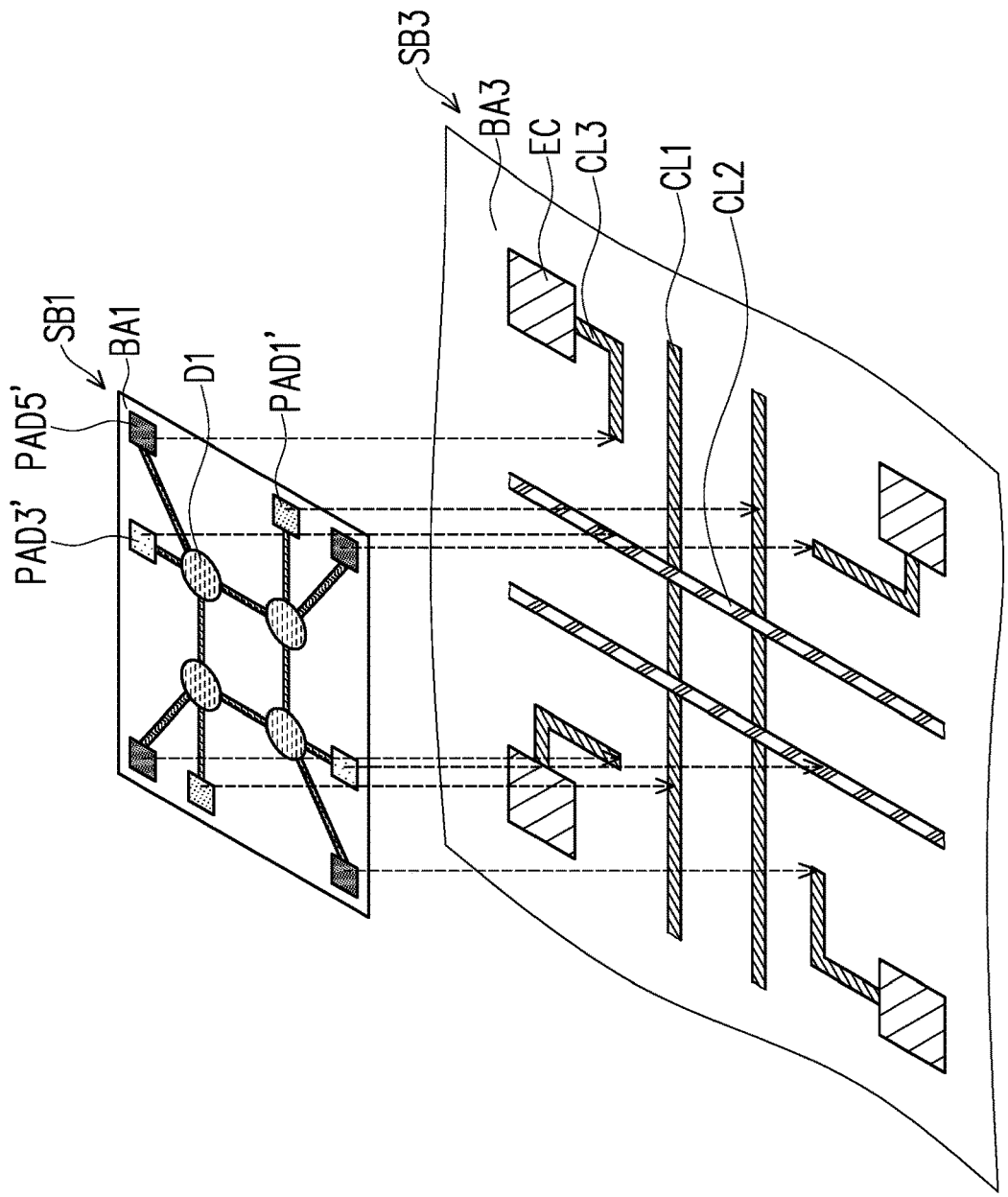
FIG. 4A is an exploded view of an electronic device according to a third embodiment of the disclosure.
Figure 4B:
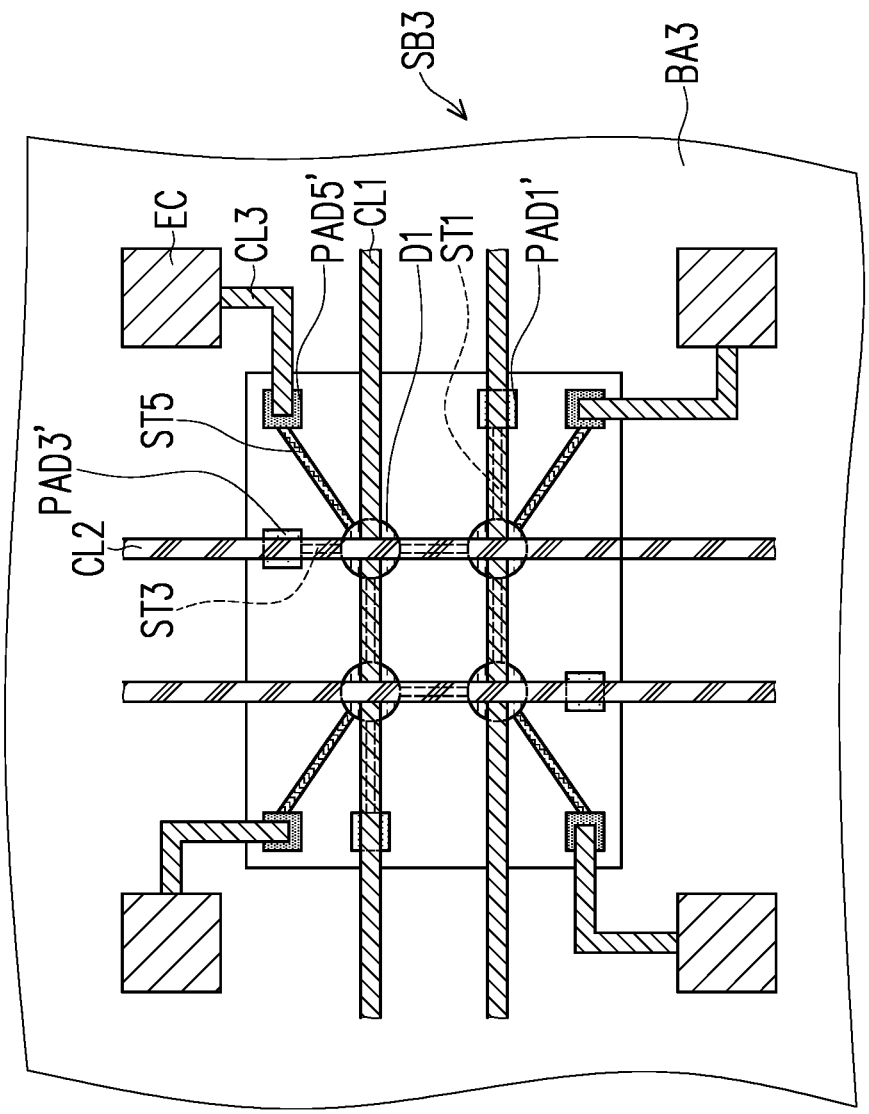
FIG. 4B is a schematic partial top view of the electronic device according to the third embodiment of the disclosure.

FIG. 4A is an exploded view of an electronic device according to a third embodiment of the disclosure, and FIG. 4B is a schematic partial top view of the electronic device according to the third embodiment of the disclosure. It should be noted that the embodiment of FIG. 4A and FIG. 4B may respectively continue to use the reference numerals and some content of the embodiment of FIG. 1A and FIG. 1B, wherein the same or similar reference numerals are adopted to denote the same or similar elements, and the description of the same technical content is omitted.

Please refer to FIG. 4A and FIG. 4B at the same time. The main difference between an electronic device 10c of the embodiment and the electronic device 10a is that the first connection line CL1 and the second connection line CL2 of the electronic device 10c are disposed on different layers.

For example, the first connection line CL1 may be connected to a gate (not shown) in the first device element D1 through a first connection pad PAD1', and the third connection line CL3 may be connected to a source (not shown) in the first device element D1 through a fifth connection pad PAD5'.

Through disposing the first connection line CL1 and the second connection line CL2 on different layers, the total number of the connection pads disposed on the first substrate SB1 and the second substrate SB2 may be further reduced, as detailed below.

In the embodiment, the first connection pad PAD1' includes a first input connection pad but does not include a first output connection pad and is arranged in the second direction d2. It is worth noting that the first connection pads PAD1' are disposed in a staggered arrangement in the second direction d2 to improve the stability of the first substrate SB1, but the disclosure is not limited thereto. In the embodiment, each first connection pad PAD1' is disposed corresponding to the first device element D1 arranged in the second direction d2. In the embodiment, there are n1 first device elements D1 arranged in the first direction d1, and there are n2 first device elements D1 arranged in the second direction d2, then the first substrate SB1 may include n2 first connection pads PAD1', but the disclosure is not limited thereto. The numbers of the first connection pads PAD1' and the first device elements D1 may have the same or different.

In the embodiment, the third connection pad PAD3' includes a third input connection pad but does not include a third output connection pad and is arranged in the first direction d1. It is worth noting that the third connection pads PAD3' are disposed in a staggered arrangement in the first direction d1 to improve the stability of the first substrate SB1, but the disclosure is not limited thereto. In the embodiment, each third connection pad PAD3' is disposed corresponding to the first device element D1 arranged in the first direction d1. In the embodiment, there are n1 first device elements D1 arranged in the first direction d1, and there are n2 first device elements D1 arranged in the second direction d2, then the first substrate SB1 may include n1 third connection pads PAD3', but the disclosure is not limited thereto. The numbers of the third connection pads PAD3' and the first device elements D1 may be the same or different.

In the embodiment, the fifth connection pad PAD5' may be disposed corresponding to the first device element D1 or the electronic element EC. That is, in the embodiment, there are n1 first device elements D1 arranged in the first direction d1, and there are n2 first device elements D1 arranged in the second direction d2, then the first substrate SB1 may include n1*n2 fifth connection pads PAD5', but the disclosure is not limited thereto. The numbers of the fifth connection pads PAD5' and the first device elements D1 may be the same or different.

In general, the quantitative relationship between the first device elements D1 and the first connection pads PAD1', the third connection pads PAD3', and the fifth connection pads PAD5' of the embodiment may be summarized in Table 8 below.

TABLE 8

| Number of first device element D1 (n1*n2, n1 = 2, n2 = 2) | Number of first connection pad PAD1' (n2) | Number of third connection pad PAD3' (n1) | Number of fifth connection pad PAD5' (n1*n2) | Total number of connection pad (n2 + n1 + n1*n2) | Total number of connection pad/Number of first device element D1 |
|---|---|---|---|---|---|
| 4 | 2 | 2 | 4 | 8 | 2.0 |

It is worth noting that the quantitative relationship between the first device elements D1 and the first connection pads PAD1', the third connection pads PAD3', and the fifth connection pads PAD5' of the disclosure is not limited to Table 8. For example, if there are 4 first device elements D1 arranged in the first direction d1 (n1=4), and there is 1 first device element D1 arranged in the second direction d2 (n2=1), the number of the first connection pad PAD1' may be 1 (n2), the number of the third connection pads PAD3 may be 4 (n1), the number of the fifth connection pads PAD5 may be 4 (n1*n2), and the total number of the connection pads is 9 (n2+n1+n1*n2), as shown in Table 9 below.

TABLE 9

| Number of first device element D1 (n1*n2, n1 = 4, n2 = 1) | Number of first connection pad PAD1' (n2) | Number of third connection pad PAD3' (n1) | Number of fifth connection pad PAD5' (n1*n2) | Total number of connection pad (n2 + n1 + n1*n2) | Total number of connection pad/Number of first device element D1 |
|---|---|---|---|---|---|
| 4 | 1 | 4 | 4 | 9 | 2.25 |

In the embodiment, the arrangement manner of the second device elements D2 is the same as or similar to the arrangement manner of the first device elements D1, that is, the second device elements D2 may also be disposed in an array arrangement. Based on this, reference may be made to the arrangement manner and the number of the first device elements D1 for the arrangement manner and the number of the second device elements D2, which will not be repeated here. However, in other embodiments, the arrangement manner of the second device elements D2 may be different from the arrangement manner of the first device elements D1.

Based on this, reference may be made to the foregoing embodiment for the arrangement manner of the second device elements D2 included in the second substrate SB2 and the second connection pads, the fourth connection pads, and the sixth connection pads of the embodiment, and the quantitative relationship therebetween, that is, the same may be the same as or similar to the arrangement manner of the first device elements D1 included in the first substrate SB1 and the first connection pad PAD1', the third connection pads PAD3', and the fifth connection pads PAD5', and the quantitative relationship therebetween, but the disclosure is not limited thereto.

Based on the above, through disposing the first connection line CL1 and the second connection line CL2 of the electronic device 10c on different layers, the ratio of the total number of the connection pads of the electronic device 10c to the number of the first device elements D1 (or the second device elements D2) may be relatively reduced, which can further reduce the number of the connection pads dispose to reduce the process cost.

In summary, in the electronic device provided by some embodiments of the disclosure, the first device elements (or the second device elements) are formed on the first substrate (or the second substrate), which can reduce the number of the connection pads pf the first substrate (or the second substrate) and can reduce the number of times of bonding between the first substrate (or the second substrate) and the third substrate to reduce the process cost of forming the electronic device. Furthermore, the electronic device of some embodiments of the disclosure may include the suitable first device element (or second device element) and the corresponding electronic element, so that the electronic device may be applied to different technical fields, so that the electronic device provided by some embodiments of the disclosure may be applied to the requirements of various fields.

In addition, in the electronic device provided by other embodiments of the disclosure, through disposing the first connection line and the second connection line on the same layer, the process steps and/or the number of masks used when forming the first connection line and the second connection line can be reduced, so as to reduce the design difficulty of the third substrate to improve the yield of the electronic device.

Furthermore, in the electronic device provided by yet other embodiments of the disclosure, through disposing the first connection line and the second connection line on different layers, the ratio of the total number of the connection pads in the electronic device to the number of the first device elements (or the second device elements) can be relatively reduced, which can further reduce the number of the connection pads disposed to reduce the process cost.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or some or all of the technical features thereof may be equivalently replaced. However, the modifications or replacements do not cause the essence of the corresponding technical solutions to deviate from the scope of the technical solutions of the embodiments of the disclosure.

What is claimed is:

1. An electronic device, comprising:
a plurality of electronic elements;
a first substrate, comprising a first device element and a first connection pad;
a second substrate, comprising a second device element and a second connection pad; and
a third substrate, comprising a first connection line, wherein the first connection pad and the second connection pad are coupled to the first connection line, and the first substrate, the second substrate, and the electronic elements are disposed on the third substrate.

2. The electronic device according to claim 1, wherein the first device element is coupled to the first connection pad; and/or the second device element is coupled to the second connection pad.

3. The electronic device according to claim 1, wherein the first device element and the second device element comprise at least one thin film transistor.

4. The electronic device according to claim 1, wherein the electronic element comprises a photoelectric element, a thermoelectric element, a piezoelectric element, a sensing element, or an antenna element.

5. The electronic device according to claim 1, wherein the first connection line and the second connection line are disposed on a same layer.

6. The electronic device according to claim 1, wherein the first connection line is a scan line, and the second connection line is a data line.

7. The electronic device according to claim 1, wherein the first substrate further comprises a fifth connection pad and a fifth signal transmission line, the second substrate further comprises a sixth connection pad and a sixth signal transmission line, and the third substrate further comprises a third connection line.

8. The electronic device according to claim 7, wherein the first device element is coupled to the fifth connection pad through the fifth signal transmission line, and the electronic elements are coupled to the fifth connection pad through the third connection line.

9. The electronic device according to claim 7, wherein the second device element is coupled to the sixth connection pad through the sixth signal transmission line, and the electronic elements are coupled to the sixth connection pad through the third connection line.

10. The electronic device according to claim 7, wherein the first substrate comprises $n1*n2$ of the fifth connection pads, where $n1$ and $n2$ are positive integers, and at least one of $n1$ and $n2$ is greater than or equal to 2.

11. The electronic device according to claim 1, wherein the first substrate and the second substrate are disposed on the third substrate.

12. The electronic device according to claim 1, wherein shapes of the first substrate and the second substrate are square or rectangular.

13. The electronic device according to claim 1, wherein the first substrate comprises $n1*n2$ of the first device elements, where $n1$ and $n2$ are positive integers, and at least one of $n1$ and $n2$ is greater than or equal to 2.

14. The electronic device according to claim 1, wherein the first substrate comprises $2*n2$ of the first connection pads, where $n2$ is a positive integer.

15. The electronic device according to claim 1, wherein the first substrate comprises $n2$ of the first connection pads, where $n2$ is a positive integer.

16. The electronic device according to claim 1, wherein the first substrate comprises $2*n1$ of the third connection pads, where $n1$ is a positive integer.

17. The electronic device according to claim 1, wherein the first substrate comprises $n1$ of the third connection pads, where $n1$ is a positive integer.

18. The electronic device according to claim 1, wherein the first connection line and the second connection line are disposed on different layers.

19. The electronic device according to claim 1, wherein the first substrate and the second substrate comprise chips, and the third substrate comprises a wafer.

* * * * *